(12) United States Patent
Mihara

(10) Patent No.: US 6,788,581 B2
(45) Date of Patent: Sep. 7, 2004

(54) NON-VOLATILE SEMICONDUCTOR MEMORY DEVICE CONFIGURED TO REDUCE RATE OF ERRONEOUSLY READING DATA FROM MEMORY CELL

(75) Inventor: Masaaki Mihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/337,342

(22) Filed: Jan. 7, 2003

(65) Prior Publication Data

US 2004/0008540 A1 Jan. 15, 2004

(30) Foreign Application Priority Data

Jul. 15, 2002 (JP) ........................................ 2002-205784

(51) Int. Cl.[7] ............................................. G11C 16/06
(52) U.S. Cl. .............................. 365/185.21; 365/185.24
(58) Field of Search ....................... 365/185.21, 185.11, 365/185.24, 196, 207, 189.04

(56) References Cited

U.S. PATENT DOCUMENTS 6,477,090 B2 * 11/2002 Yamaki et al. ......... 365/189.09

FOREIGN PATENT DOCUMENTS

JP 9-91974 4/1997

* cited by examiner

*Primary Examiner*—Thong Le
(74) *Attorney, Agent, or Firm*—McDermott Will & Emery LLP

(57) ABSTRACT

A transistor operating as a current source supplying a memory cell with a current is configured to operate in a saturation range when a node subjected to a decision as to whether a memory cell has a high or low level has a voltage in a range of no more than a threshold voltage.

8 Claims, 12 Drawing Sheets

NON-VOLATILE SEMICONDUCTOR MEMORY DEVICE CONFIGURED TO REDUCE RATE OF ERRONEOUSLY READING DATA FROM MEMORY CELL

BACKGROUND OF THE INVENTION

1. Field of the Invention

The present invention relates to non-volatile semiconductor memory devices providing reduced probabilities of erroneously reading data from memory cells.

2. Description of the Background Art

A non-volatile semiconductor memory device having a memory cell in the form of a transistor having a threshold voltage varying as a stored data level varies has its data read via a so-called discharging read circuit, a circuit through current detection, and the like.

For example, when the discharging read circuit is used, a memory cell has its content read, as follows: the time when a memory cell hardly passes an electric current as its content is read is the time when a low level is read. By contrast, the time when a high level is read is the time when a memory cell capable of passing an electric current larger than that of a saturation range of a transistor operating as an electric current source connected to a node subjected to a decision between the high and low levels (note that hereinafter the transistor will be referred to as a "current source transistor"), has its content read. The discharging read circuit can thus determine whether a memory cell has the voltage of the high level or that of the low level.

A conventional discharging read circuit, however, has used a current source transistor which has not necessarily been given consideration to operate in an appropriate range, so that data may be read erroneously. More specifically, when the low level is read by the conventional discharging read circuit, a data line may have noise thereon or charge-share may be introduced so that the node subjected to a decision between the high and low levels may have a voltage drop to permit the current source transistor to supply an electric current smaller than the transistor's saturation current, when the current source transistor operates in a linear range and data may thus be read erroneously.

FIG. 11 shows a configuration of a conventional discharging read circuit. As shown in FIG. 11, the conventional discharging read circuit, i.e., a non-volatile semiconductor memory device 106 includes a memory cell array 1 having a plurality of memory cells (not shown), an n-channel MOS transistor NM1 operative in a data read in response to a clock signal CNT to electrically couple nodes N3 and N4 together, a p-channel MOS transistor Tr15 provided between a power supply voltage Vcc and n-channel MOS transistor NM1 and acting as a current source transistor, and an inversion circuit 3 having as an input a connection node connecting p- and n-channel MOS transistors Tr15 and NM1 together to receive, invert and output a voltage level of an input signal.

Memory cell array 1 includes a word line and a bit line, and a word line decoder and a bit line decoder (not shown) for selecting a single memory cell from the plurality of memory cells. By way example, p-channel MOS transistor Tr15 has a threshold voltage of 0.6V and inversion circuit 3 has a threshold voltage of 1.5V for the sake of illustration.

N-channel MOS transistor NM1 is connected to memory cell array 1 through a node N4. P-channel MOS transistor Tr15, constantly supplying a current, typically has its gate connected to a ground voltage GND.

Node N3 is designed to be sufficiently short to be hardly affected by noise. By contrast, in general, node N4, providing a connection between n-channel MOS transistor NM1 and memory cell array 1, would inevitably be sufficiently longer than node N3. In nodes N3 and N4 there exist parasitic capacitances C2 and C1, respectively, and there exist a relationship C1>C2. Power supply voltage Vcc is set to be 3V for the sake of illustration.

FIG. 12 represents a characteristics curve T1$a$ representing characteristics of p-channel MOS transistor Tr15 for a value k of 1.2 $\mu A/V^2$. Value k indicates how readily/hardly p-channel MOS transistor Tr15 passes an electric current. In the figure, the vertical axis represents the electric current passed by p-channel MOS transistor Tr15 and the horizontal axis represents the voltage of node N3.

It is understood from the FIG. 12 curve T1$a$ that p-channel MOS transistor Tr15 in a saturation range passes a current (a saturation current) having a value of 7.2 $\mu A$. Furthermore, for curve T1$a$, p-channel MOS transistor Tr15 for a voltage smaller than 0.6V operates in the saturation range and for a voltage larger than 0.6V operates in a linear range.

Reference will now be made to FIGS. 11 and 12 to describe how non-volatile semiconductor memory device 106 operates when the high and low levels are read therefrom. When data is not read, node N3 has a voltage of 3V.

In reading data of the high level, a memory cell selected from the plurality of memory cells of memory cell array 1 (hereinafter referred to as a selected memory cell) is by way example capable of passing a maximal current of 10 $\mu A$ for the sake of illustration. Whether an output OUT is the high or low level is determined as follows: it has the high level when node N3 has a voltage smaller than the threshold voltage of inversion circuit 3, and it has the low level when node N3 has a voltage larger than the threshold voltage of inversion circuit 3.

In a data read, with p-channel MOS transistor Tr15 having a saturation current of 7.2 $\mu A$, a selected memory cell can pass a larger amount of current than p-channel MOS transistor Tr15. As such, node N3 subjected to a decision between the high and low levels has a voltage drop substantially to 0V.

Thus the node N3 voltage is smaller than the inversion circuit's threshold voltage of 1.5V and output OUT is set to be the high level.

Should node N4 have noise thereon or between nodes N3 and N4 charge-share be introduced and node N3 have a voltage dropping to be lower than the threshold voltage of 1.5V of inversion circuit 3, output OUT is set to be the high level and data is not read erroneously.

When the low level is read, a selected memory cell hardly passes a current, for the sake of illustration. By way of example, the selected memory cell provides a leak current of 0.1 $\mu A$.

In a data read, the selected memory cell can only pass a current of 0.1 $\mu A$. As such, node N3 subjected to a decision between the high and low levels hardly has a voltage drop. It substantially has a voltage of 3V.

If in this state for example node N4 has noise thereon or between nodes N3 and N4 charge-share is introduced and as a result node N3 has a voltage drop and instantly a current between 6 $\mu A$ and 7.2 $\mu A$ is passed allowing p-channel MOS transistor Tr15 to operate in the linear range, then node N3 has a voltage reduced to be smaller than the threshold voltage of 1.5V of inversion circuit 3 and despite that low-level data should be read, output OUT is set to be the high level and data would be read erroneously.

Thus in the conventional non-volatile semiconductor memory device a current source transistor's appropriate gate voltage level has not particularly been considered. As a result, when a node subjected to a decision between the high and low levels has a voltage falling within a range of no more than a threshold voltage, the current source transistor tends to operate in a linear range. As such, in reading the low level when charge-share, noise on a data line, or the like causes an electric current smaller than the current source transistor's saturation current to flow, a node subjected to a decision with respect to voltage can have a voltage of no more than the threshold voltage. Because of such a phenomenon, the conventional non-volatile semiconductor memory device has a high possibility that data is read from a memory cell erroneously.

SUMMARY OF THE INVENTION

The present invention contemplates a nonvolatile semiconductor memory device preventing erroneous reading of data in reading the low level when noise on a data line, charge-share, or the like has an effect to allow a current source transistor to supply an electric current of no more than a saturation current.

In summary, the present invention includes a plurality of memory cells, a data line, a sense amplifier circuit and a first voltage setting circuit. The data line is electrically coupled with a single cell selected from the plurality of memory cells in a data read operation. The sense amplifier circuit detects a current of the data line in the data read operation. The sense amplifier circuit includes a first current source supplying the data line with a current in the data read operation. The first current source has a first internal node connected to the data line in the data read operation and a first transistor electrically coupled between the first internal node and a power supply voltage. The sense amplifier circuit further includes a first conversion circuit comparing a voltage of the first internal node with a first threshold voltage in the data read operation. The first voltage setting circuit sets a voltage of a gate of the first transistor to operate the first transistor in a saturation range when the first internal node has a voltage in a range of no more than the first threshold voltage.

A main advantage of the present invention lies in that it can implement a non-volatile semiconductor memory device capable of providing a reduced probability of erroneously reading data from a memory cell as a transistor operating as a current source in a sense amplifier circuit can be configured to operate in a saturation range if an internal node subjected to a decision between the high and low levels has a voltage falling within a range of no more than a threshold voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
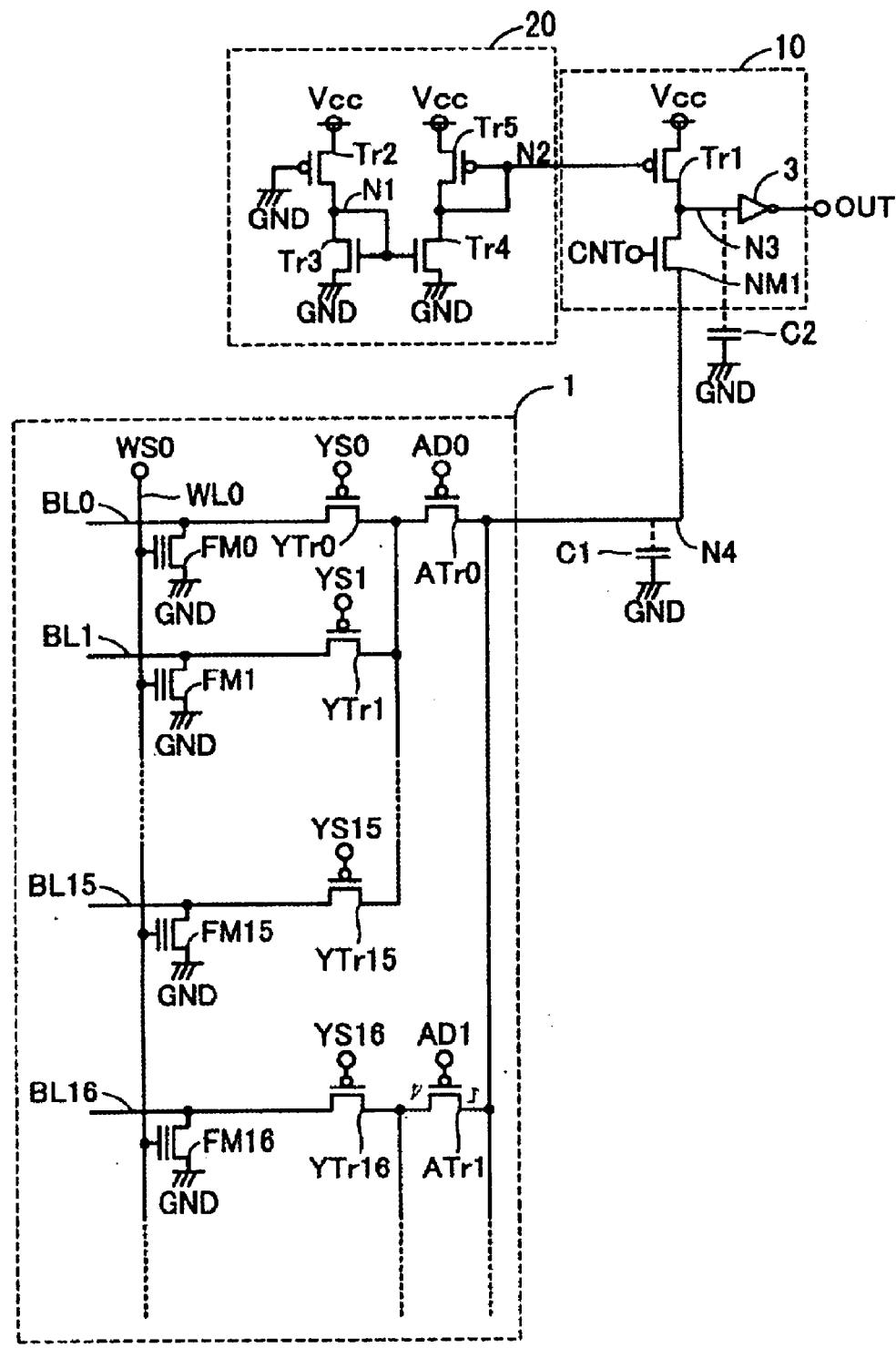
FIG. 1 shows a configuration of a non-volatile semiconductor memory device of the present invention in a first embodiment.

Hereinafter the present invention in embodiments will be described with reference to the drawings. In the figures, like reference characters denote like components.

First Embodiment

With reference to FIG. 1, a first embodiment provides a non-volatile semiconductor memory device 100 including a memory cell array 1 having a plurality of memory cells, a sense amplifier circuit 10 and a voltage setting circuit 20.

Memory cell array 1 includes p-channel MOS transistors ATr0, ATr1, p-channel MOS transistors Ytr0, YTr1–YTr16, non-volatile memory cells FM0, FM1–FM16, a word line WL0, and bit lines BL0, BL1–BL16. This configuration in memory cell array 1 is merely one example and in fact there exist more p-channel MOS transistors, non-volatile memory cells, and word and bit lines than in the configuration of memory cell array 1.

P-channel MOS transistors ATr0 and ATr1 have their respective sources connected to a node N4. P-channel MOS transistor ATr0 has its drain connected to p-channel MOS transistors YTr0, YTr1–YTr15 at their respective sources. P-channel MOS transistors Ytr0, YTr1–YTr16 have their respective drains connected to bit lines BL0, BL1–BL16, respectively. Bit lines BL0, BL1–BL16 are connected to non-volatile memory cells FM0, FM1–FM16 at their respective drains, respectively. Word line WL0 is connected to non-volatile memory cells FM0, FM1–FM16 at their respective control gates. P-channel MOS transistor ATr1 has its drain connected to p-channel MOS transistor YTr16 at the source.

P-channel MOS transistor ATr0 and p-channel MOS transistors Ytr0, YTr1–YTr15 operate in response to a block select signal AD0, bit line select signals YS0–YS15 and a word line select signal WS0 to select a desired non-volatile memory cell connected to a desired one of bit lines BL0–BL15.

Sense amplifier circuit 10 includes an n-channel MOS transistor NM1 operative in a data read in response to a clock signal CNT to electrically couple nodes N3 and N4 together, a p-channel MOS transistor Tr1 provided between a power supply voltage Vcc and n-channel MOS transistor NM1 and acting as a current source transistor, and an inversion circuit 3 having as an input a connection node connecting p- and n-channel MOS transistors Tr1 and NM1 together to receive, invert and output a voltage level. By way of example, p-channel MOS transistor Tr1 has a threshold voltage of 0.6V and inversion circuit 3 has a threshold voltage of 1.5V for the sake of illustration.

N-channel MOS transistor NM1 is connected to memory cell array 1 via node N4. Node N4 corresponds to a data line electrically coupled with one of a plurality of memory cells in a data read.

Voltage setting circuit 20 includes p- and n-channel MOS transistors Tr2 and Tr3 connected in series between power supply voltage Vcc and a ground voltage GND, and p- and n-channel MOS transistors Tr5 and Tr4 connected in series between power supply voltage Vcc and ground voltage GND. Voltage setting circuit 20 sets the voltage of the gate of p-channel MOS transistor Tr1 to have a desired value.

P-channel MOS transistor Tr2 has its gate connected to ground voltage GND. N-channel MOS transistors Tr3 and Tr4 have their respective gates connected to a connection node N1 connecting p- and n-channel MOS transistors Tr2 and Tr3 together. P-channel MOS transistor Tr5 has its gate connected to a connection node N2 connecting p- and n-channel MOS transistors Tr5 and Tr4 together and to the gate of p-channel MOS transistor Tr1.

Nodes N2 and N3 are designed to be sufficiently short to be hardly affected by noise. By contrast, node N4, providing a connection to memory cell array 1, in general would inevitably be sufficiently longer than nodes N2 and N3. In nodes N3 and N4 there exist parasitic capacitances C2 and C1, respectively, and there exist a relationship C1>C2. Power supply voltage Vcc is set to be 3V for the sake of illustration.

When node N3 connected to the current source p-channel MOS transistor Tr1 and subjected to a decision between the high and low levels has a voltage in a range of no more than the threshold voltage of inversion circuit 3, p-channel MOS transistor Tr1 can still operate in a saturation range. To achieve this, p-channel MOS transistor Tr1 and the transistors in voltage setting circuit 20 have characteristics determined as designed by a method, as follows:

By way of example, p-channel MOS transistors Tr1, Tr2 and Tr5 and n-channel MOS transistors Tr3 and Tr4 have a threshold voltage of 0.6V for the sake of illustration.

To operate p-channel MOS transistor Tr1 in the saturation range with node N3 having a voltage of no more than the threshold voltage of inversion circuit 3, the condition that the gate voltage of transistor Tr1 plus the threshold voltage of the transistor is larger than the threshold voltage of inversion circuit 3, i.e., 1.5V must at least be satisfied. To satisfy the condition, a design is adopted to allow the gate voltage of p-channel MOS transistor Tr1 plus the threshold voltage of the transistor to be equal to the threshold voltage of 1.5V of inversion circuit 3 plus a margin of 0.6V, i.e., 2.1V. In other words, a design is adopted to allow p-channel MOS transistor Tr1 to operate in the saturation range for the node N3 voltage smaller than 2.1V.

As p-channel MOS transistor Tr1 has the threshold voltage of 0.6V, when node N3 has a voltage of 2.1V, node N2 has a voltage of 1.5V. P-channel MOS transistor Tr1 in the saturation range passes a current Ids obtained as follows:

$$Ids=k(Vgs-Vth)^2 \quad (1),$$

wherein Ids represents the value of a current flowing in the saturation range, k having large values indicates that the transistor can pass larger amounts of current, Vgs represents a gate-source voltage, and Vth represents a threshold voltage.

By way of example, if p-channel MOS transistor Tr1 operating in the saturation range passes a current of 7.2 μA, expression (1) with Ids=7.2, Vgs=−1.5, and Vth=−0.6 substituted therein provides k=8.9. P-channel MOS transistor Tr1 can thus be determined having characteristics of a characteristics curve T1 with value k of 8.9 μA/V$^2$, as shown in FIG. 2.

Figure 2:
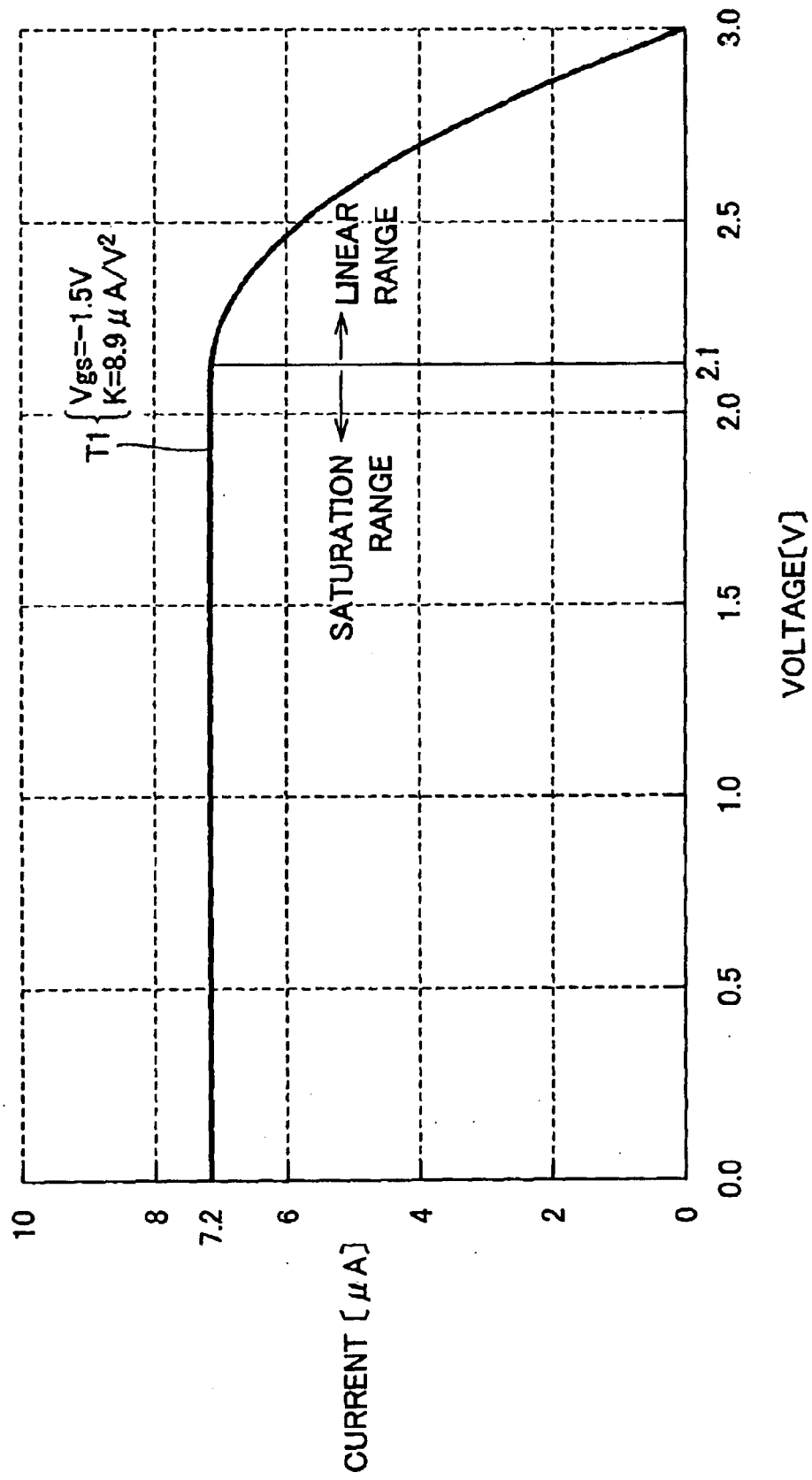
FIG. 2 represents characteristics of a p-channel MOS transistor Tr1 used in the non-volatile semiconductor memory device of the present invention.

In FIG. 2 the horizontal axis represents the voltage of node N3 and the vertical axis represents the current passed by p-channel MOS transistor Tr1. It can be understood from curve T1 that when node N3 has a voltage smaller than 2.1V, p-channel MOS transistor Tr1 operates in the saturation range.

Then the current flowing through p-channel MOS transistor Tr1 and that flowing through p-channel MOS transistor Tr5 are equalized. To do so, transistor Tr5 having the same value k as transistor Tr1 is used. Since transistor Tr5 has its gate and drain short-circuited, transistor Tr5 provides a characteristic curve T5, as shown in FIG. 3.

Figure 3:
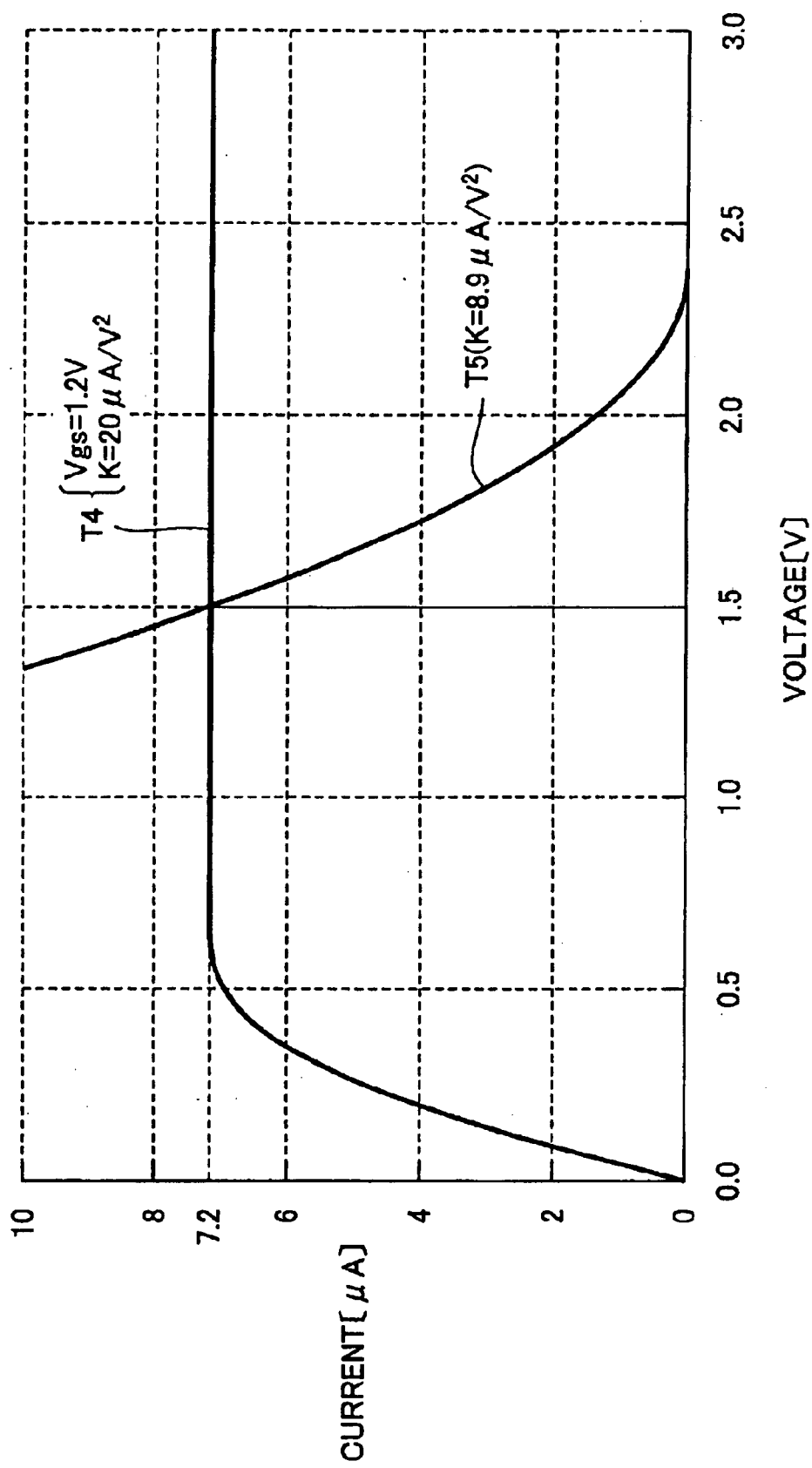
FIG. 3 represents characteristics of n- and p-channel MOS transistors Tr4 and Tr5 used in the non-volatile semiconductor memory device of the present invention.

In FIG. 3 the horizontal axis represents the voltage of node N2 and the vertical axis represents currents passed by n- and p-channel MOS transistors Tr4 and Tr5.

Since node N2 has a voltage of 1.5V, value k and Vgs of n-channel MOS transistor Tr4 are so determined that curve T5 and characteristics curve T4 of transistor Tr4 intersect at 1.5V. Herein by way of example node N1 has a voltage of 1.2V for the sake of design. As node N2 has the voltage of 1.5V, n-channel MOS transistor Tr4 in the saturation range passes a current of 7.2 μA, as understood from curve T5. Expression (1) with Ids=7.2 μA, Vgs=1.2V, and Vth=0.6 substituted therein provides k=20. N-channel MOS transistor Tr4 can thus be determined having characteristics of curve T4 with value k of 20 μA/V$^2$, as shown in FIG. 3.

Then currents flowing through n-channel MOS transistors Tr4 and Tr3 are equalized. To do so, transistor Tr3 having the same value k as transistor Tr4 is used. Since p-channel MOS transistor Tr2 has its gate connected to ground voltage GND, node N1 attains a voltage corresponding to power supply voltage Vcc, i.e., 3V. P-channel MOS transistor Tr3 thus has Vgs=3V. P-channel MOS transistor Tr3 thus provides a characteristics curve T3, as shown in FIG. 4.

Figure 4:
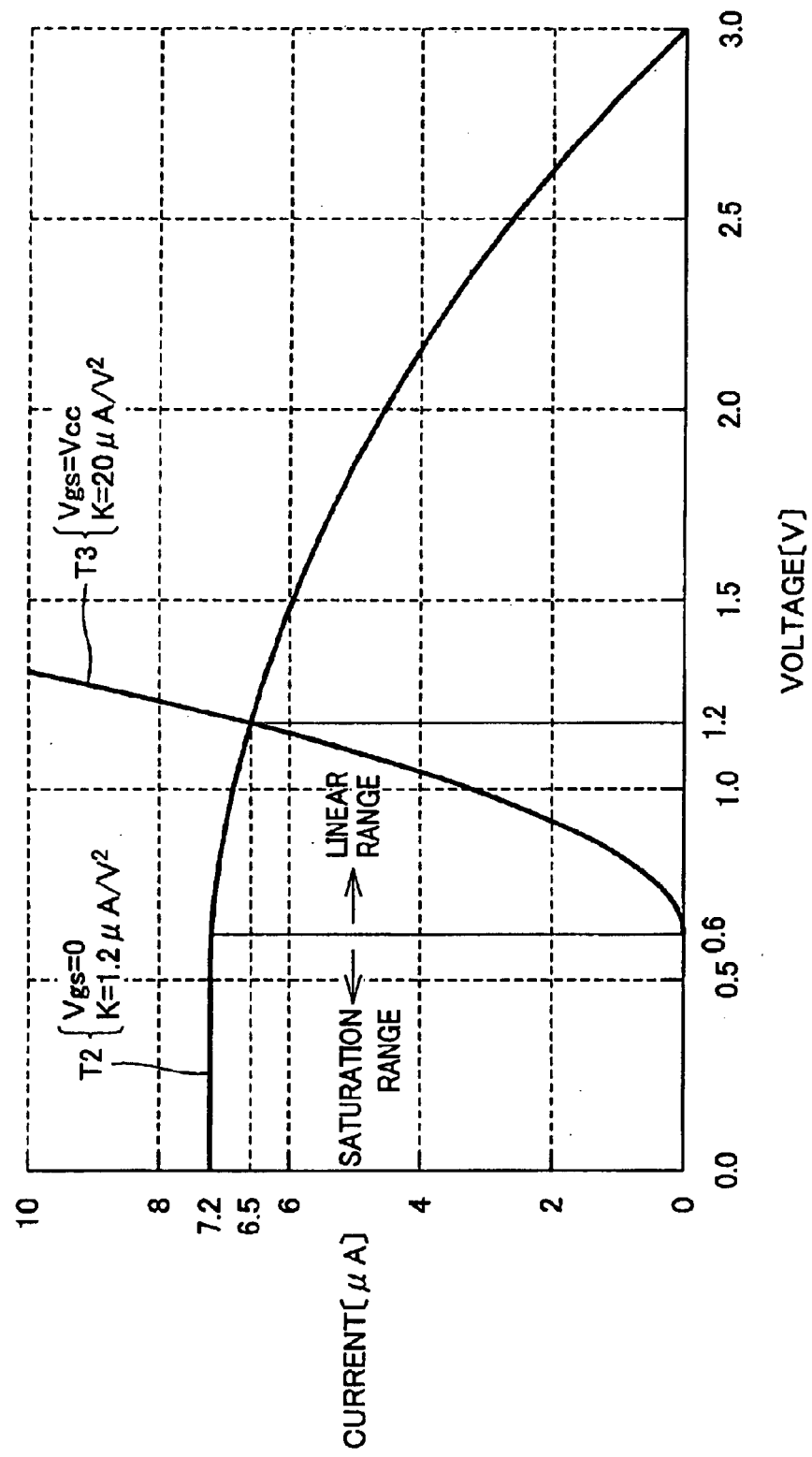
FIG. 4 represents characteristics of p- and n-channel MOS transistors Tr2 and Tr3 used in the non-volatile semiconductor memory device of the present invention.

In FIG. 4, the horizontal axis represents the voltage of node N1 and the vertical axis represents currents passed by p- and n-channel MOS transistors Tr2 and Tr3.

Since node N1 has the voltage of 1.2V for the sake of design, value k of p-channel MOS transistor Tr2 is so obtained that characteristics curve T3 and a characteristics curve T2 of p-channel MOS transistor Tr2 intersect at 1.2V. It can be understood from curve T3 that when node N1 has the voltage of 1.2V, n-channel MOS transistor Tr3 has a current of 6.5 μA flowing therethrough. For the linear range, when node N1 has the voltage of 1.2V, p-channel MOS transistor Tr2 passes a current Ids obtained as follows:

$$Ids=k((Vgs-Vth)^2-(Vgd-Vth)^2) \quad (2).$$

Expression (2) with Ids=6.5, Vgs=−3, Vth=−0.6, and Vgd=−1.2 substituted therein provides k=1.2. P-channel MOS transistor Tr2 can thus be determined having characteristics of a characteristics curve T2 with value k of 1.2 μA/V$^2$, as shown in FIG. 4.

Characteristics of p-channel MOS transistor Tr1 and those of the transistors in voltage setting circuit 20 can thus be determined.

Reference will now be made to FIGS. 1 and 2 to describe how non-volatile semiconductor memory device 100 operate when the high and low levels are read therefrom. When data is not read, node N3 has a voltage of 3V.

In reading the high level, data is correctly read, as has been described for conventional non-volatile semiconductor memory device 106.

In reading the low level, a selected memory cell hardly passes a current, for the sake of illustration. By way of example, the selected memory cell provides a leak current of 0.1 µA for the sake of illustration.

In a data read, the selected memory cell can only pass the current of 0.1 µA. As such, node N3 hardly has a voltage drop. It substantially has a voltage of 3V. If in this state for example node N4 has noise thereon or between nodes N3 and N4 charge-share is introduced and as a result node N3 has a voltage drop and a current smaller than 7.2 µA, the saturation current of p-channel MOS transistor Tr1, flows through node N3, the node N3 voltage does not drop to be lower than the boundary voltage between the saturation and linear ranges, i.e., 2.1V as the current source p-channel MOS transistor Tr1 has characteristics curve T1. Node 3 thus does not have a voltage smaller than the inversion circuit's threshold voltage of 1.5V, as in conventional non-volatile semiconductor memory device 106, and data can thus be read correctly.

Thus in non-volatile semiconductor memory device 100 in accordance with the first embodiment a current source transistor has a gate voltage set to have an appropriate value to allow the current source transistor to operate in a saturation range when a node connected to a p-channel MOS transistor Tr1, which acts as the current source transistor, and subjected to a decision between the high and low levels has a voltage falling within a range of no less than a threshold voltage. As such, if for example a data read line has noise thereon or charge-share is introduced and a current smaller than the current source transistor's saturation current is generated, a selected memory cell can be read correctly.

Second Embodiment

Figure 5:
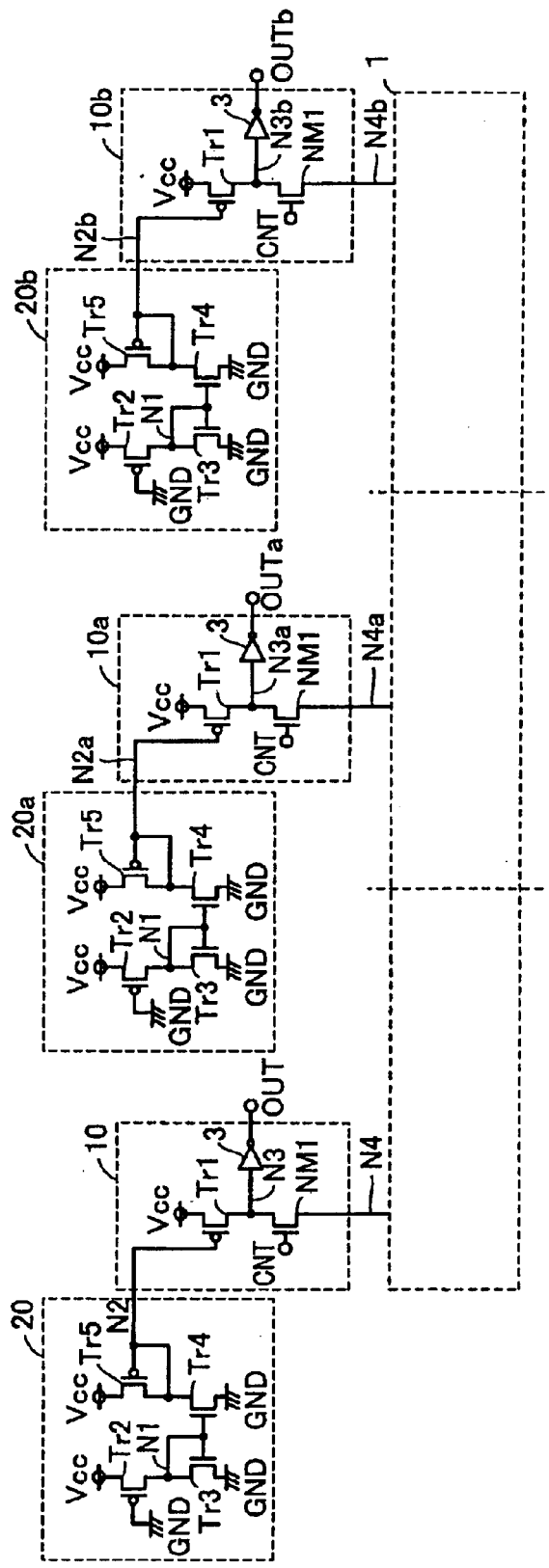
FIGS. 5–8 show configurations of the non-volatile semiconductor memory device of the present invention in second to fifth embodiments, respectively.

With reference to FIG. 5, the present invention in a second embodiment provides a non-volatile semiconductor memory device 101 identical in configuration to non-volatile semiconductor memory device 100 of the first embodiment shown in FIG. 1, except that memory cell array 1 is divided into a plurality of memory cell blocks, that there are further provided voltage setting circuits 20a and 20b similar in configuration to voltage setting circuit 20, and that there are further provided sense amplifier circuits 10a and 10b similar in configuration to sense amplifier circuit 10.

Sense amplifier circuits 10a and 10b are identical in configuration to sense amplifier circuit 10 of FIG. 1 except that output signals OUTa and OUTb correspond to output signal OUT, that nodes N2a and N2b correspond to node N2 and that nodes N4a and N4b correspond to node N4.

The plurality of memory cell blocks each have a plurality of a memory cells. Furthermore, memory cell array 1 includes a word line and a bit line, and a word line decoder and a bit line decoder (not shown) for selecting a single memory cell from the plurality of memory cells of each memory cell block.

Voltage setting circuits 20, 20a and 20b include p-channel MOS transistors Tr5s, respectively, having their respective gates connected to the gates of p-channel MOS transistors Tr1 of sense amplifier circuits 10, 10a and 10b via nodes N2, N2a and N2b, respectively. Sense amplifier circuits 10, 10a and 10b are connected to their respective single memory cell blocks via nodes N4, N4a and N4b, respectively. In a data read, nodes N4, N4a and N4b are each electrically coupled with one of the plurality of memory cells of the corresponding memory cell block.

Nodes N2, N2a and N2b and nodes N3, N3a and N3b are designed to be sufficiently short to be less affected by noise. In general, nodes N4, N4a and N4b, providing a connection to memory cell array 1, would inevitably be sufficiently longer than nodes N2, N2a and N2b and nodes N3, N3a and N3b.

As well as the in first embodiment, voltage setting circuits 20, 20a and 20b set gate voltages respectively of p-channel MOS transistors Tr1s of sense amplifier circuits 10, 10a and 10b to allow transistors Tr1s to each operate in a saturation range if at least one of nodes N3, N3a and N3b connected to the current source p-channel MOS transistors Tr1s and subjected to a decision between the high and low levels has a voltage of no more than a threshold voltage.

In reading the low level, non-volatile semiconductor memory device 101 operates, as will be described hereinafter. Sense amplifier circuits 10, 10a and 10b each read data of a memory cell selected from the plurality of memory cells of the corresponding memory cell block. Non-volatile semiconductor memory device 101 is similar in operation to non-volatile semiconductor memory device 100 of the first embodiment when data are read from the selected memory cells.

Thus the second embodiment provides non-volatile semiconductor memory device 101 having a plurality of memory cell blocks each having a plurality of memory cells. Memory cells are selected from the memory cell blocks, respectively, and their data are output to a plurality of destinations, respectively. Data of a plurality of memory cells can thus be read simultaneously.

Furthermore in non-volatile semiconductor memory device 101 current source transistors Tr1s in sense amplifier circuits 10, 10a and 10b each have a gate voltage set to have an appropriate value to allow the current source transistors to each operate in a saturation range when at least one of nodes N3, N3a and N3b connected to the current source transistors and subjected to a decision between the high and low levels has a voltage in a range of no more than the threshold voltage of inversion circuit 3. As such, if a data read line has noise thereon or charge-share is introduced and a current smaller than the current source transistor's saturation current is generated, a selected memory cell can be read correctly.

Third Embodiment

Figure 6:
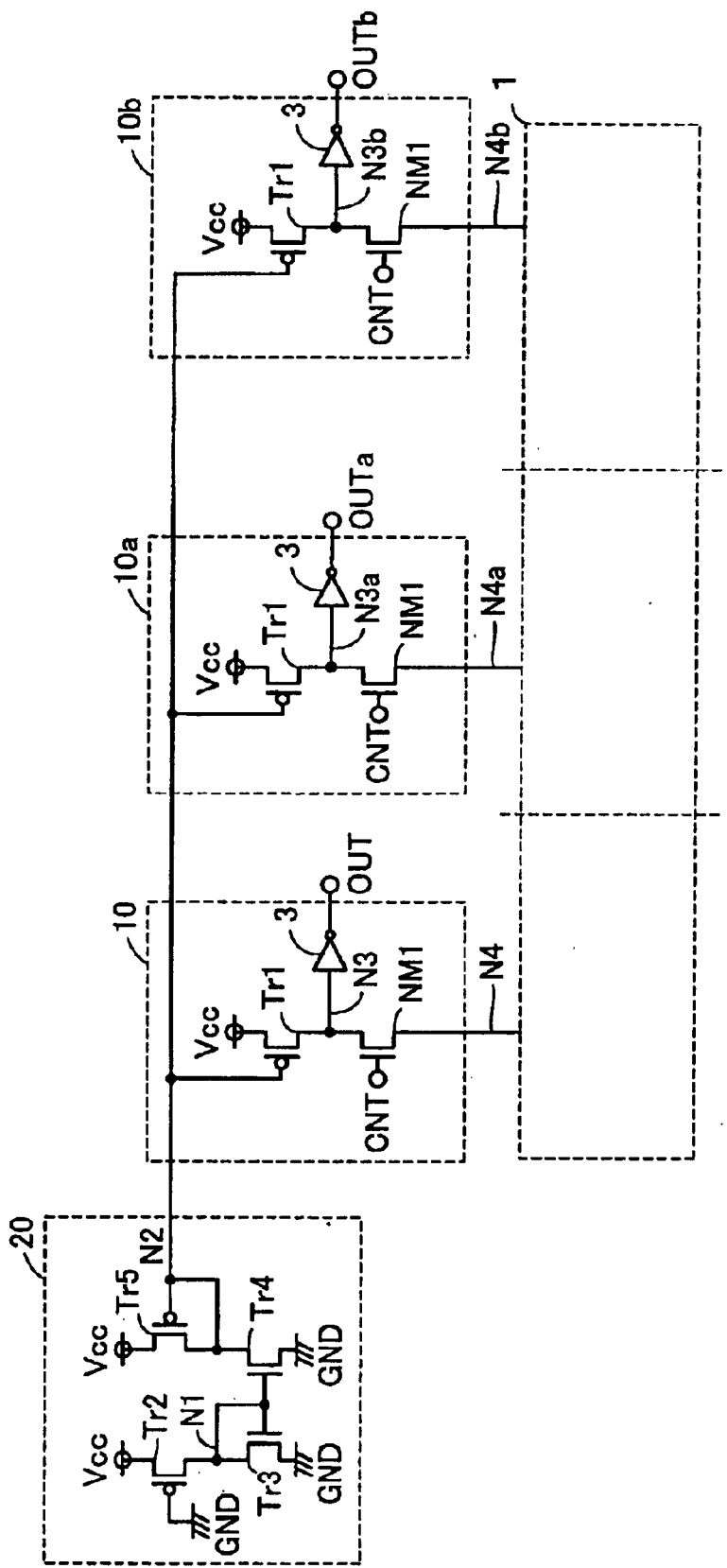

With reference to FIG. 6, the present invention in a third embodiment provides a non-volatile semiconductor memory device 102 identical in configuration to non-volatile semiconductor memory device 101 of the second embodiment shown in FIG. 5, except that voltage setting circuits 20a and 20b are excluded and that node N2 is connected to the gates of p-channel MOS transistors Tr1s of sense amplifier circuits 10a and 10b, respectively.

Voltage setting circuit 20 includes p-channel MOS transistor Tr5 having its gate connected via node N2 to the gates of p-channel MOS transistors Tr1s of sense amplifier circuits 10, 10a and 10b. In other words, voltage setting circuit 20 distributes voltage to sense amplifier circuits 10, 10a and 10b through node N2. In general, node N2 would inevitably be sufficiently longer than node N2 of non-volatile semiconductor memory device 101 of the second embodiment.

As well as in the first embodiment, voltage setting circuit 20 set gate voltages respectively of p-channel MOS transistors Tr1s of sense amplifier circuits 10, 10a and 10b to each have an appropriate value to allow transistors Tr1s to each operate in a saturation range even if at least one of nodes N3, N3a and N3b connected to the current source p-channel MOS transistors Tr1s and subjected to a decision between the high and low levels has a voltage of no more than the threshold voltage of inversion circuit 3.

In reading the low level, non-volatile semiconductor memory device 102 is similar in operation to non-volatile semiconductor memory device 100 of the first embodiment.

As has been described above, the third embodiment provides non-volatile semiconductor memory device 102 distributing voltage to a plurality of sense amplifier circuits through node N2. Consequently, in general, node N2 would inevitably be sufficiently increased in length. As a result, non-volatile semiconductor memory device 102 is disadvantageously more susceptible to noise than non-volatile semiconductor memory device 101.

However, non-volatile semiconductor memory device 102 differs from non-volatile semiconductor memory device 101 in that a single voltage setting circuit is connected to a plurality of sense amplifier circuits. As such, non-volatile semiconductor memory device 102, as well as non-volatile semiconductor memory device 101, allows a plurality of data to be read simultaneously. Furthermore, non-volatile semiconductor memory device 102 with only a single voltage setting circuit allows the circuit area to be smaller than non-volatile semiconductor memory device 101 having a plurality of voltage setting circuits.

Fourth Embodiment

Figure 7:
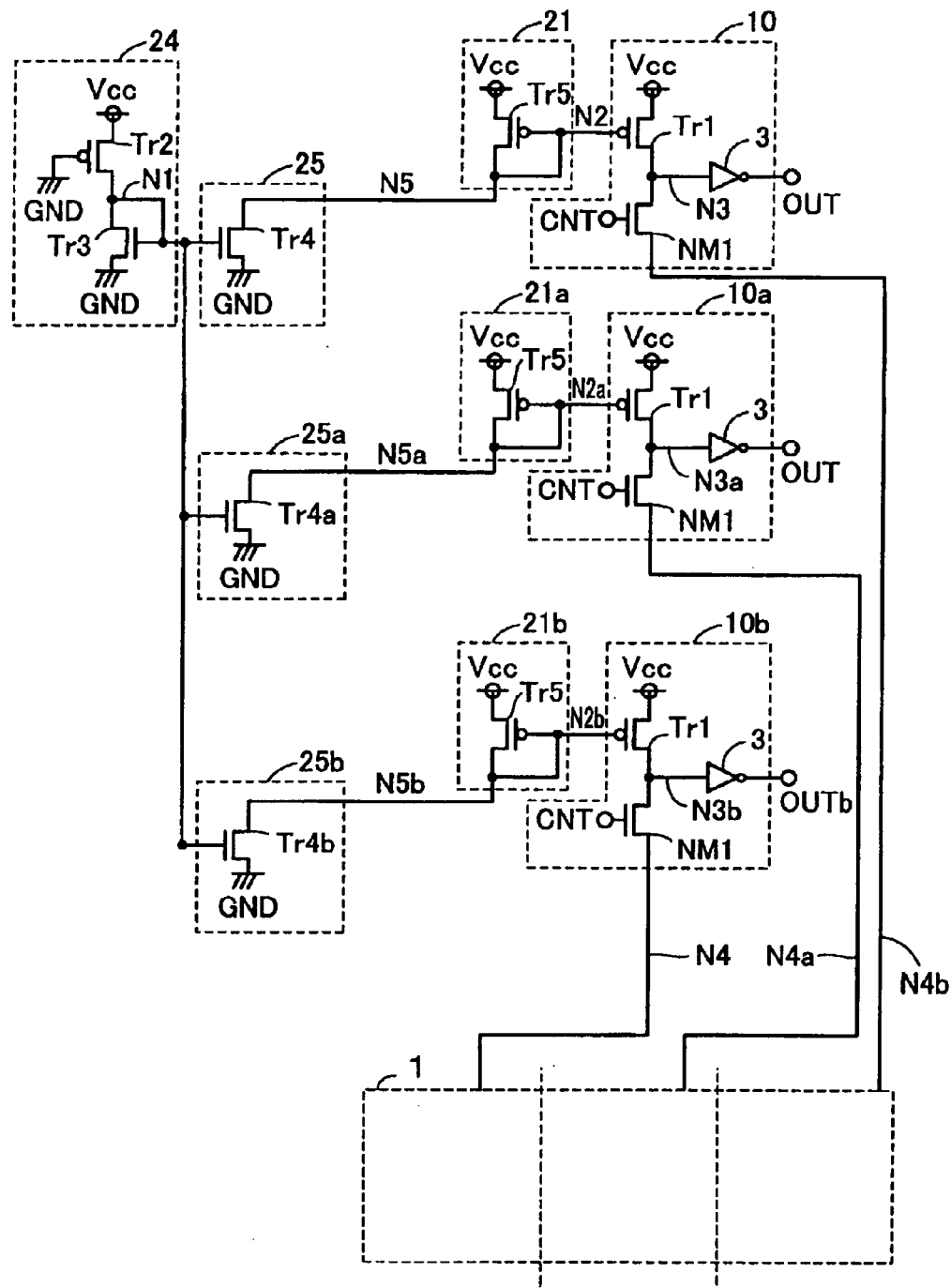

With reference to FIG. 7, the present invention in a fourth embodiment provides a non-volatile semiconductor memory device 103 identical in configuration to non-volatile semiconductor memory device 102 of the third embodiment shown in FIG. 6, except that a voltage setting circuit 24 replaces voltage setting circuit 20 and that there are further provided voltage setting circuits 21, 21a, 21b and current sources 25, 25a, 25b.

Voltage setting circuit 24 includes p- and n-channel MOS transistors Tr2 and Tr3 connected in series between power supply voltage Vcc and ground voltage GND. Voltage setting circuit 24 generates a voltage intermediate between power supply voltage Vcc and ground voltage GND.

Current sources 25, 25a and 25b include n-channel MOS transistors Tr4, Tr4a and Tr4b, respectively. Current sources 25, 25a and 25b supply voltage setting circuits 21, 21a and 21b, respectively, with a current based on the intermediate voltage generated by voltage setting circuit 24.

N-channel MOS transistors Tr4, Tr4a and Tr4b each operate as a current source. Transistors Tr4, Tr4a, Tr4b are provided between nodes N5, N5a, N5b, respectively, and ground voltage GND.

Voltage setting circuit 24 includes p-channel MOS transistor Tr2 having its gate connected to ground voltage GND, and n-channel MOS transistor Tr3 having its gate connected to connection node N1 connecting p- and n-channel MOS transistors Tr2 and Tr3 together and to the gates of n-channel MOS transistors Tr4, Tr4a and Tr4b.

Voltage setting circuits 21, 21a and 21b are provided with p-channel MOS transistors Tr5s, respectively, between power supply voltage Vcc and nodes N5, N5a and N5b, respectively. P-channel MOS transistors Tr5s have their respective gates connected to their drains and the gates of p-channel MOS transistors Tr1s of sense amplifier circuits 10, 10a and 10b, respectively.

N-channel MOS transistors Tr4, Tr4a and Tr4b corresponding to current sources 25, 25a and 25b, respectively, have their drains connected via nodes N5, N5a and N5b to the drains of p-channel MOS transistors Tr5s of voltage setting circuits 21, 21a and 21b, respectively. In other words, n-channel MOS transistors Tr4, Tr4a and Tr4b acting as current source transistors supply a current to p-channel MOS transistors Tr5s of voltage setting circuits 21, 21a and 21b through nodes N5, N5a and N5b, respectively.

Voltage setting circuits 21, 21a and 21b set gate voltages respectively of the current source transistors of sense amplifier circuits 10, 10a and 10b to each have an appropriate value to allow transistors Tr1s to each operate in a saturation range even if at least one of nodes N3, N3a and N3b connected to the current source, p-channel MOS transistors Tr1s and subjected to a decision between the high and low levels has a voltage of no more than the threshold voltage of inversion circuit 3.

In reading the low level, non-volatile semiconductor memory device 103 is similar in operation to non-volatile semiconductor memory device 100 of the first embodiment.

As has been described above, non-volatile semiconductor memory device 103 of the fourth embodiment is different from non-volatile semiconductor memory device 102 in that the former further includes voltage setting circuits 21a and 21b and n-channel MOS transistors Tr4a and Tr4b. As such the former disadvantageously requires a more or less larger circuit area than the latter.

In non-volatile semiconductor memory device 103, however, current sources 25, 25a and 25b supply a current to voltage setting circuits 21, 21a and 21b through nodes N5, N5a and N5b, respectively, and voltage setting circuits 21, 21a and 21b set voltages of nodes N2, N2a and N2b in vicinities of sense amplifier circuits 10, 10a and 10b, respectively. As such, non-volatile semiconductor memory device 103 in the current distribution system is advantageously less susceptible to noise than non-volatile semiconductor memory device 102 in the voltage distribution system.

Fifth Embodiment

Figure 8:
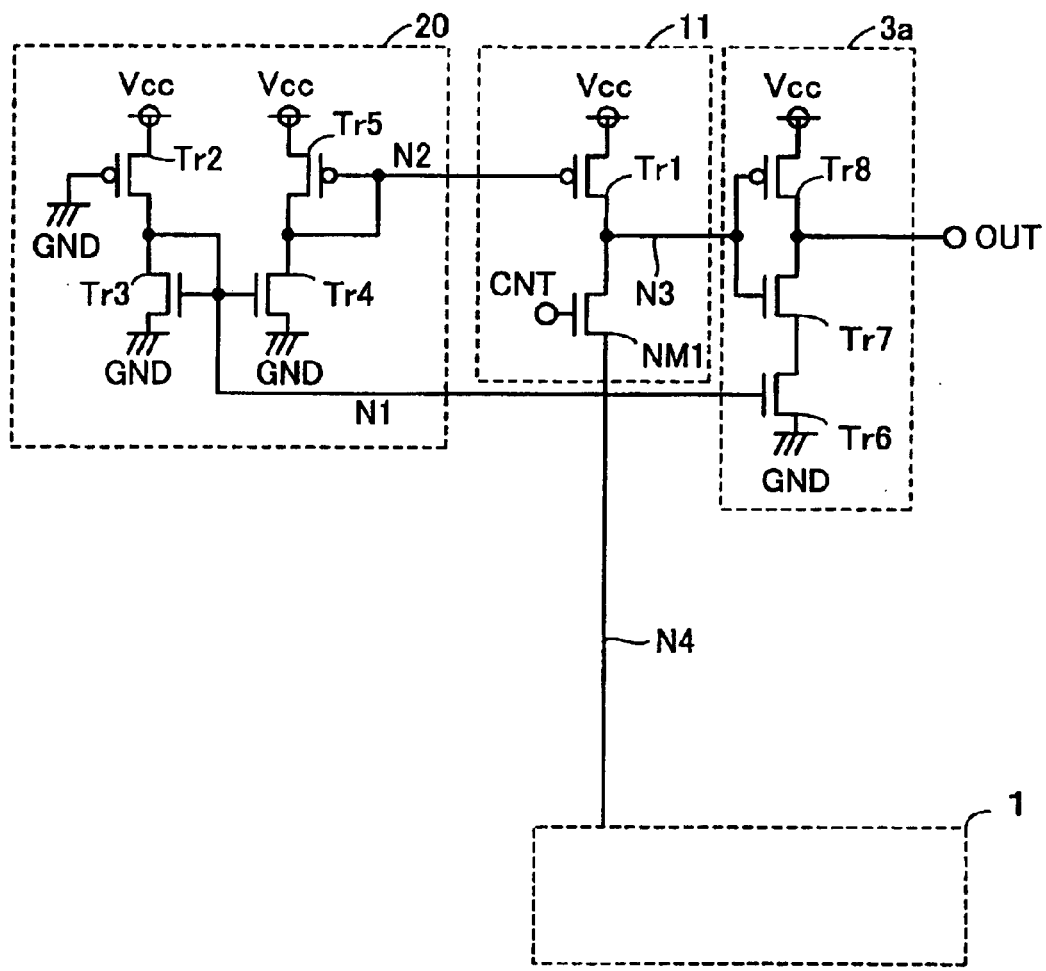

With reference to FIG. 8, the present invention in a fifth embodiment provides a non-volatile semiconductor memory device 104 identical in configuration to non-volatile semiconductor memory device 100 of the first embodiment shown in FIG. 1, except that a sense amplifier circuit 11 replaces sense amplifier circuit 10, that an inversion circuit 3a is further provided and that voltage setting circuit 20 has node N1 connected to inversion circuit 3a.

Sense amplifier circuit 11 is identical to sense amplifier circuit 10, except that the former excludes inversion circuit 3.

Inversion circuit 3a includes a p-channel MOS transistor Tr8 and n-channel MOS transistors Tr7 and Tr6 connected in series between power supply voltage Vcc and ground voltage GND. P-channel MOS transistor Tr8 operates as a current source. N-channel MOS transistor Tr6 have the same characteristics as n-channel MOS transistor Tr4 for the sake of illustration. P-channel MOS transistor Tr8 has a threshold voltage of 0.6V for the sake of illustration.

P-channel MOS transistor Tr8 has its gate and drain connected to the gate and drain, respectively, of n-channel MOS transistor Tr7. P- and n-channel MOS transistors Tr8 and Tr7 have their respective gates connected together by a connection node connected to node N3. N-channel MOS transistor Tr6 has its gate connected to node N1. Nodes N1 and N2 have the same voltages as applied in the first embodiment, i.e., 1.2V and 1.5V, respectively, for the sake of illustration. Furthermore, power supply voltage Vcc is set to be 3V for the sake of illustration. Inversion circuit 3a has a logical threshold voltage of 1.5V for the sake of illustration.

Figure 9:
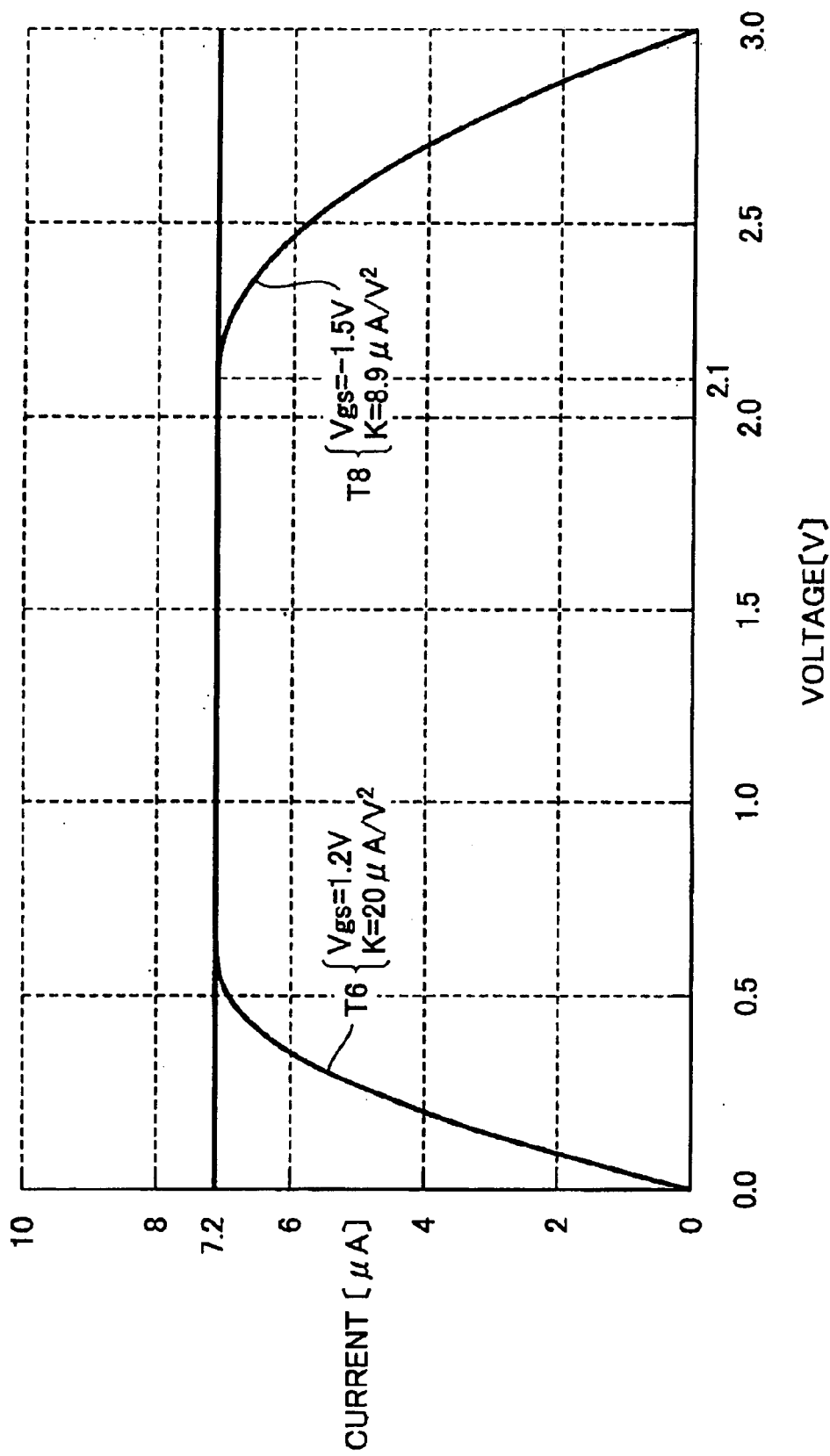
FIG. 9 represents characteristics of n- and p-channel MOS transistors Tr6 and Tr8 used in the non-volatile semiconductor memory device of the present invention.

In reading data from non-volatile semiconductor memory device 104 if node N3 has a voltage of no more than the threshold voltage of inversion circuit 3a, p-channel MOS transistor Tr8 acting as a current source transistor can still operate in a saturation range. To achieve this, p-channel MOS transistor Tr8 of inversion circuit 3a has characteristics determined, as designed by a method, as follows:

With reference to FIG. 9, n-channel MOS transistor Tr6, having the same characteristics as n-channel MOS transistor Tr4, provides a value k and a characteristics curve represented by a characteristics curve T6, which is identical to curve T4 shown in FIG. 3. As such, n-channel MOS transistor Tr6 in a saturation range can pass a current of 7.2 μA.

In FIG. 9, the horizontal axis represents the voltage of node N3 and the vertical axis represents currents passed by p- and n-channel MOS transistors Tr8 and Tr6.

Since inversion circuit 3a has the logical threshold voltage of 1.5V, a design is adopted to allow p-channel MOS transistor Tr8 to operate in the saturation range when node N3 has a voltage of 1.5V. If node N3 has the voltage of 1.5V, p-channel MOS transistor Tr8 provides Vgs=−1.5V. Since n-channel MOS transistor Tr6 is only allowed to pass the limited current of 7.2 μA, expression (1) with Ids=7.2, Vgs=−1.5, and Vth=−0.6 substituted therein provides k=8.9. As such, p-channel MOS transistor Tr8 can be determined having characteristics of a characteristics curve T8 with a value k of 8.9 μA/V$^2$, as shown in FIG. 9.

Reference will now be made to FIGS. 8 and 9 to describe how non-volatile semiconductor memory device 104 operates when the low level is read therefrom. When data is not read, node N3 has a voltage of 3V. In memory cell array 1 a selected memory cell hardly passes a current for the sake of illustration. By way of example, the selected memory cell is able to pass a current of 0.1 μA for the sake of illustration.

In a data read, a selected memory cell can only pass a current of 0.1 μA. As such, node N3 hardly has a voltage drop. It substantially has 3V. If in this state node N4 has noise thereon or between nodes N3 and N4 charge-share is introduced and as a result node N3 has a voltage drop and a current smaller than the saturation current of p-channel MOS transistor Tr8, i.e., 7.2 μA, flows through node N3, the node N3 voltage does not drop to be lower than the boundary voltage between saturation and linear ranges, i.e., 2.1V as the current source p-channel MOS transistor Tr8 has characteristics curve T8. As such, the node N3 voltage is not reduced to be smaller than the inversion circuit's threshold voltage, i.e., 1.5V, as in conventional non-volatile semiconductor memory device 106. Data can thus be read correctly.

Thus the fifth embodiment provides non-volatile semiconductor memory device 104 configured to allow the current source p-channel MOS transistor Tr8 to operate in a saturation range even if a node connected to the current source p-channel MOS transistor Tr8 and subjected to a decision between the high and low levels has a voltage in a range of no more than the threshold voltage of inversion circuit 3a. If for example a data read line has noise thereon or charge-share is introduced and a current smaller than the saturation current of the current source p-channel MOS transistor Tr8 is generated, a selected memory cell can be read correctly.

Sixth Embodiment

Figure 10:
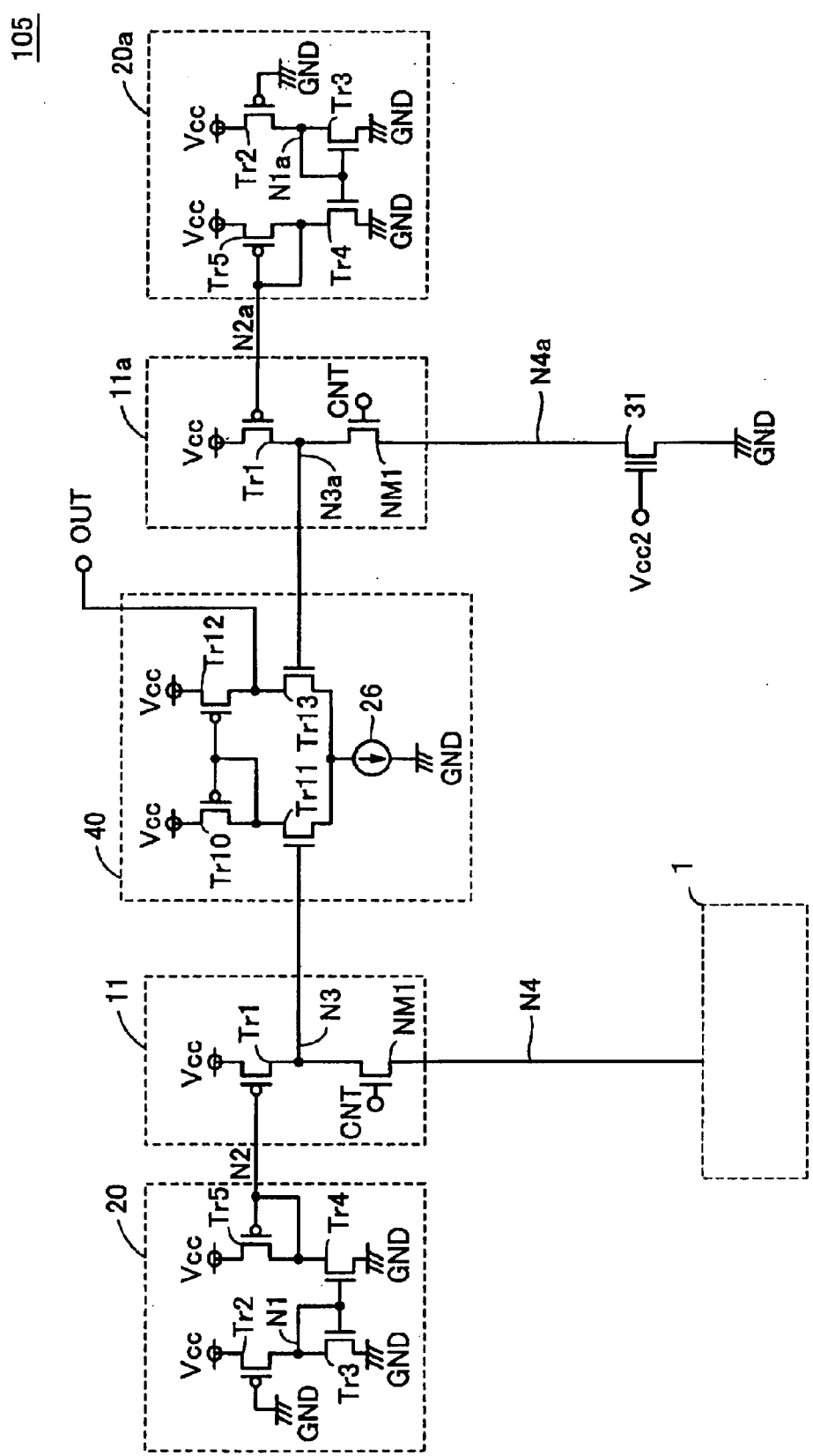
FIG. 10 shows a configuration of the non-volatile semiconductor memory device of the present invention in a sixth embodiment.
Figure 11:
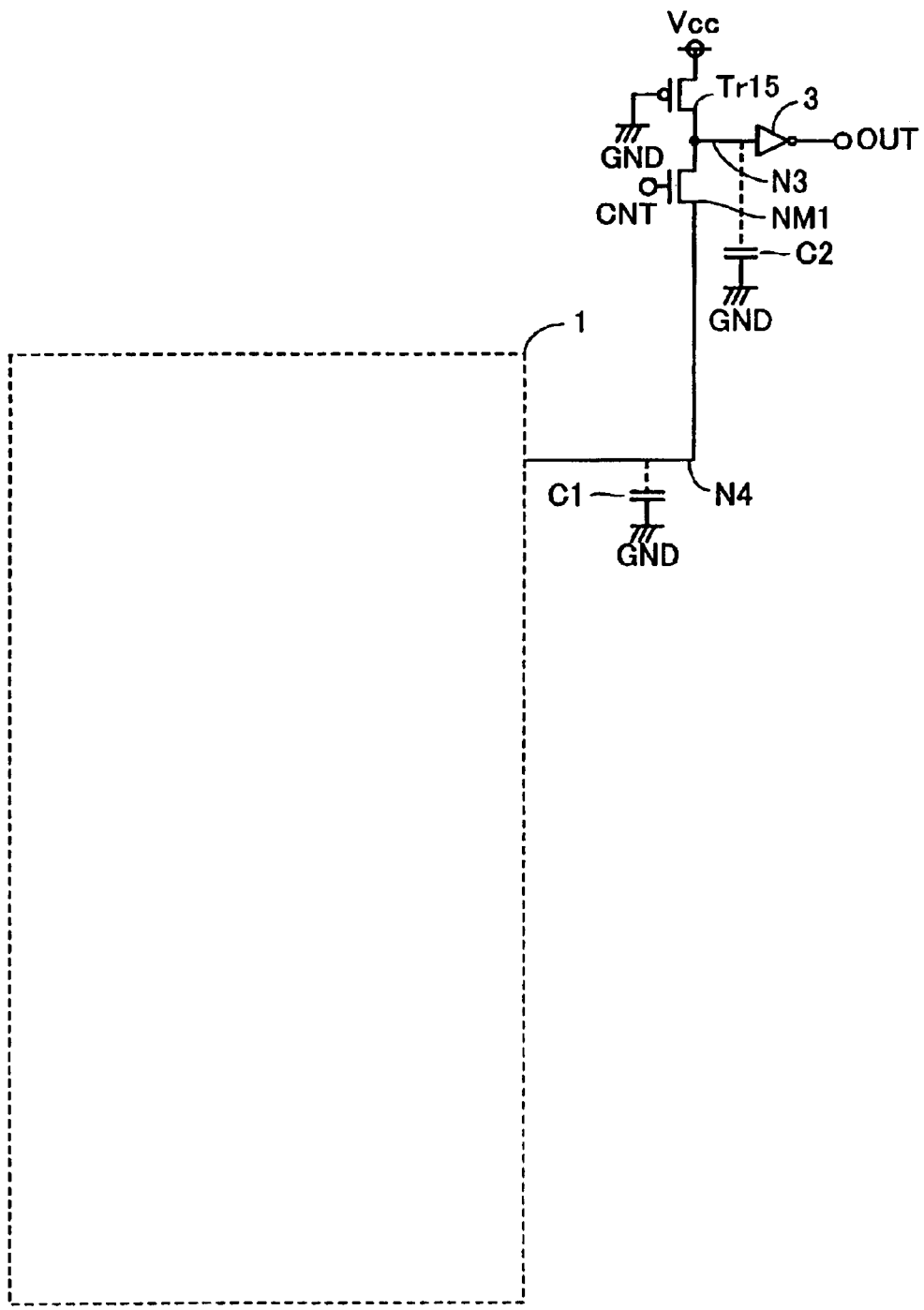
FIG. 11 shows a configuration of a conventional non-volatile semiconductor memory device.
Figure 12:
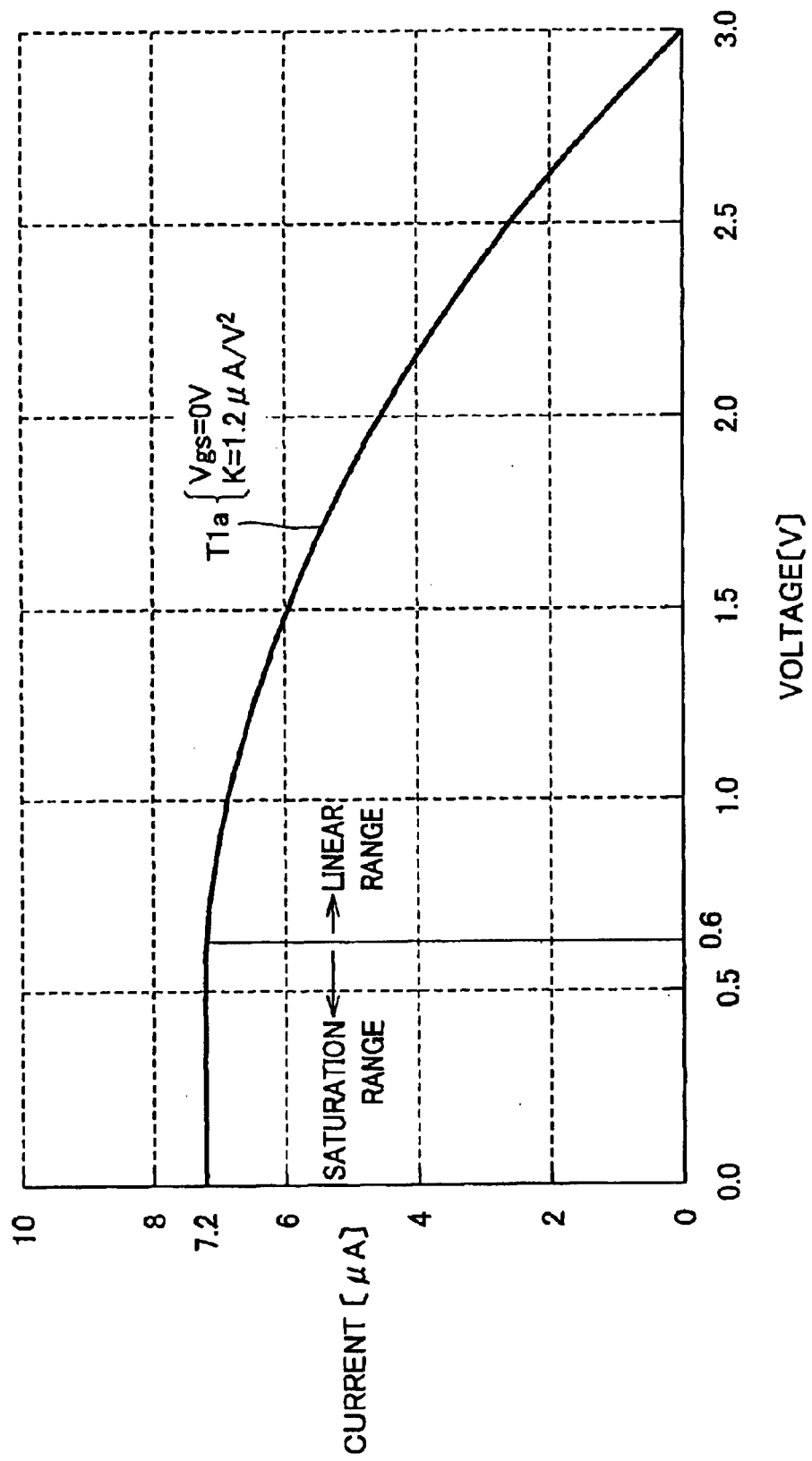
FIG. 12 represents characteristics of p-channel MOS transistor Tr15 used in a conventional non-volatile semiconductor memory device.

With reference to FIG. 10, the present invention in a sixth embodiment provides a non-volatile semiconductor memory device 105 identical in configuration to non-volatile semiconductor memory device 100 of the first embodiment shown in FIG. 1, except that sense amplifier circuit 11 replaces sense amplifier circuit 10 and that there are further provided voltage setting circuit 20a similar in configuration to voltage setting circuit 20, a sense amplifier circuit 11a similar in configuration to sense amplifier circuit 11, a differential amplification circuit 40 and a non-volatile memory cell 31.

In voltage setting circuit 20a, as compared with voltage setting circuit 20, nodes N1a and N2a correspond to nodes N1 and N2, respectively. In sense amplifier circuit 11a, as compared with sense amplifier circuit 11, nodes N3a and N4a correspond to node N3 and N4, respectively.

Differential amplification circuit 40 includes a current source 26, p- and n-channel MOS transistors Tr10 and Tr11 connected in series between power supply voltage Vcc and current source 26, and p- and n-channel MOS transistors Tr12 and Tr13 connected in series between power supply voltage Vcc and current source 26. Differential amplification circuit 40 drives signal OUT high when nodes N3 and N3a have different voltages.

P-channel MOS transistor Tr10 has its gate connected to a connection node connecting p- and n-channel MOS transistors Tr10 and Tr11 together and to the gate of p-channel MOS transistor Tr12. N-channel MOS transistor Tr11 has its gate connected to node N3. N-channel MOS transistor Tr13 has its gate connected to node N3a. P- and n-channel MOS transistors Tr12 and Tr13 are connected together by a connection node, which outputs signal OUT.

Nodes N2 and N2a, N3 and N3a, and N4a are designed to be sufficiently short to be less affected by noise. In general, node N4, providing a connection to memory cell array 1, would inevitably be sufficiently longer than nodes N2 and N2a, N3 and N3a, and N4a.

Characteristics of non-volatile memory cell 31 and a voltage Vcc 2 are determined to operate non-volatile memory cell 31 as a current source providing 7.2 μA, the same current as the saturation current of p-channel MOS transistor Tr1 acting as a current source in sense amplifier circuit 11a.

In reading the low level, non-volatile semiconductor memory device 105 operates, as will be described hereinafter. When data is not read, nodes N3 and N3a have a voltage of 3V. In memory cell array 1 a selected memory cell hardly passes a current, for the sake of illustration. By way of example, the selected memory cell is able to pass a current of 0.1 μA for the sake of illustration.

In a data read, a selected memory cell can only pass a current of 0.1 μA. As such, node N3 hardly has a voltage drop. It substantially has 3V. Furthermore, node N4 passes a current of 0.1 μA. Since non-volatile memory cell 31 is capable of passing a current of 7.2 μA, node N3a has a voltage dropping for example to 1V, for the sake of illustration.

Thus nodes N3 and N4 have a difference in voltage and output OUT is accordingly set to be the high level. If in this state node N4 has external noise thereon or between nodes N3 and N4 charge-share is introduced and as a result node N3 has a voltage drop and a current smaller than the saturation current of p-channel MOS transistor Tr1, i.e., 7.2 μA, flows through node N3, the node N3 voltage does not drop to be lower than the boundary voltage between saturation and linear ranges, i.e., 2.1V as the current source p-channel MOS transistor Tr1 has characteristics curve T1, as described in the first embodiment. Since node N3a has the voltage of 1V, due to the differential amplification circuit 40 operation, data can be read correctly.

Thus in accordance with the sixth embodiment non-volatile semiconductor memory device 105 is configured to provide a predetermined potential difference between the voltage of node N3 and that of node N3a when the low level is read therefrom. Furthermore, non-volatile semiconductor memory device 105 allows a current source transistor to have a gate voltage set to have an appropriate value to allow the current source transistor to operate in a saturation range even if a node connected to the current source, p-channel MOS transistor Tr1 and subjected to a decision between the high and low levels has a voltage in a range of no more than a threshold voltage. As a result, if for example a data read line has noise thereon or charge-share is introduced and a current smaller than the current source transistor's saturation current is generated, a selected memory cell can still be read correctly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
a plurality of memory cells;
a data line arranged to be electrically coupled with a single cell selected from said plurality of memory cells in a data read operation;
a sense amplifier circuit for detecting a current of said data line in said data read operation, said sense amplifier circuit including a first current source for supplying said data line with a current in said data read operation, said first current source having a first internal node arranged to be connected to said data line in said data read operation and a first transistor arranged to be electrically coupled between said first internal node and a power supply voltage, said sense amplifier circuit further including a first conversion circuit for comparing a voltage of said first internal node with a first threshold voltage; and
a first voltage setting circuit for setting a voltage of a gate of said first transistor to operate said first transistor in a saturation range when said first internal node has a voltage in a range of no more than said first threshold voltage.

2. The non-volatile semiconductor memory device according to claim 1, wherein:
said first transistor is a p-channel MOS transistor; and
said gate voltage plus a threshold voltage of said first transistor is larger than said first threshold voltage.

3. The non-volatile semiconductor memory device according to claim 1, wherein said first voltage setting circuit is a current mirror circuit.

4. The non-volatile semiconductor memory device according to claim 1, wherein:
said plurality of memory cells are divided into a plurality of blocks; and
said data line, said sense amplifier circuit and said first voltage setting circuit are arranged for each said block.

5. The non-volatile semiconductor memory device according to claim 1, wherein:
said plurality of memory cells are divided into a plurality of blocks; and
said data line and said sense amplifier circuit are arranged for each said block and said first voltage setting circuit is shared by said plurality of blocks.

6. The non-volatile semiconductor memory device according to claim 1, further comprising a second voltage setting circuit, a second current source, and an intermediate potential generation circuit for generating a voltage intermediate between a power supply voltage and a ground voltage, wherein:
said plurality of memory cells are divided into a plurality of blocks;
said data line and said sense amplifier circuit are arranged for each said block;
said second voltage setting circuit and said second current source are arranged for each said block;
said second voltage setting circuit sets a voltage of a gate of said first transistor of said sense amplifier circuit for each said block to operate said first transistor in a saturation range when at least one said first internal node has a voltage in a range of no more than said first threshold voltage; and
said second current source supplies said plurality of second voltage setting circuits with a current depending on said intermediate voltage.

7. A non-volatile semiconductor memory device comprising:
a plurality of memory cells;
a data line arranged to be electrically coupled with a single cell selected from said plurality of memory cells in a data read operation;
a sense amplifier circuit for detecting a current of said data line in said data read operation, said sense amplifier circuit including a first current source for supplying said data line with a current in said data read operation, said first current source having a first internal node arranged to be connected to said data line in said data read operation and a first transistor arranged to be electrically coupled between said first internal node and a power supply voltage;
a first conversion circuit for comparing a voltage of said first internal node with a first threshold voltage; and
a first voltage setting circuit for setting a voltage of a gate of said first transistor to operate said first transistor in a saturation range when said first internal node has a voltage in a range of no more than said first threshold voltage, wherein
said first conversion circuit has a second current source for supplying said data line with a current in said data read operation and a current limit circuit for receiving a current from said second current source and limiting the current to a predetermined amount of current;
said second current source has a second transistor electrically coupled between said first internal node and a power supply voltage; and
said second transistor operates in a saturation range when said first internal node has a voltage in a range of no more than said first threshold voltage.

8. The non-volatile semiconductor memory device according to claim 7, further comprising:
a third current source for supplying a current equivalent in level to that of said first transistor in said data read operation;
a comparison data line electrically coupled with said third current source in said data read operation;
a fourth current source arranged to be electrically coupled with said comparison data line,
wherein said third current source includes a second internal node arranged to be connected to said comparison data line in said data read operation and a third transistor arranged to be electrically coupled between said second internal node and a power supply voltage;
a second voltage setting circuit for setting a voltage of a gate of said third transistor to operate said third transistor in a saturation range when said second internal node has a voltage in a range of no more than said first threshold voltage; and
a differential amplification circuit for detecting a difference in voltage between said first and second internal nodes,
wherein said fourth current source allows a current equivalent in level to that of said third transistor to flow through said comparison data line, and wherein in said data read operation, said single cell selected flows through said data line one of currents larger and smaller than a current supplied by said first transistor, as determined in accordance with data stored in said single cell selected.

* * * * *